United States Patent [19]
Mizuta

[11] Patent Number: 6,100,708
[45] Date of Patent: Aug. 8, 2000

[54] PROBE CARD AND WAFER TESTING METHOD USING THE SAME

[75] Inventor: Masaharu Mizuta, Hyogo, Japan

[73] Assignee: Mitsubishi Denki Kabushiki Kaisha, Tokyo, Japan

[21] Appl. No.: 09/037,511

[22] Filed: Mar. 10, 1998

[30] Foreign Application Priority Data

Sep. 26, 1997 [JP] Japan .................................. 9-262305

[51] Int. Cl.⁷ .................................................. G01R 31/02
[52] U.S. Cl. ........................ 324/762; 324/760; 324/761
[58] Field of Search .................... 324/72.5, 754, 324/760, 761, 762, 755

[56] References Cited

U.S. PATENT DOCUMENTS

| | | | |
|---|---|---|---|
| 3,613,001 | 10/1971 | Hostetter | 324/762 |
| 4,599,559 | 7/1986 | Evans | 324/754 |
| 5,055,778 | 10/1991 | Okubo et al. | 324/754 |
| 5,670,889 | 9/1997 | Okubo et al. | 324/760 |
| 5,691,651 | 11/1997 | Ehlermann | 324/760 |

FOREIGN PATENT DOCUMENTS

| | | |
|---|---|---|
| 57-146340 | 9/1982 | Japan . |
| 58-148933 | 10/1983 | Japan . |

*Primary Examiner*—Safet Metjahic
*Assistant Examiner*—Minh Tang
*Attorney, Agent, or Firm*—McDermott, Will & Emery

[57] ABSTRACT

A probe needle has one end and the other end. Probe needle has its one end fixed to the bottom surface of a substrate, and extending at a prescribed angle to substrate. A portion of probe needle positioned between the one end and the other end is pressed by a rod attacked between a pair of pillow toward substrate. Thus, an improved probe card which permits appropriate pressure needle to be provided even if the variation in the height of probe needles is large.

7 Claims, 7 Drawing Sheets

PROBE CARD AND WAFER TESTING METHOD USING THE SAME

BACKGROUND OF THE INVENTION

1. Field of the Invention

The present invention relates generally to probe cards, and more particularly, to an improved probe card which permits correct needle pressure to be provided by probe needles of different heights. The invention further relates to a method of testing wafer using such a probe card.

2. Description of the Background Art

Generally in the process of manufacturing ICs and LSIs, after manufacturing a number of wafer chips on a single substrate, there is provided a wafer testing step to test whether individual chips are non-defective or defective prior to slicing them on a chip-basis. In such wafer testing, a probe card is connected to a device called prober and the probe needle of the probe card is set in contact with a prescribed electrode (pad) of a semiconductor chip. After making the probe needle contact with the semiconductor chip, fixed pressure (referred to as "needle pressure") is applied between the probe needle and the pad (the operation is referred to as "overdrive".) By the overdrive, the probe needle slides on the pad surface to remove aluminum oxide on the pad surface. Thus, aluminum which was under the aluminum oxide is electrically connected with the probe needle.

Figure 14:
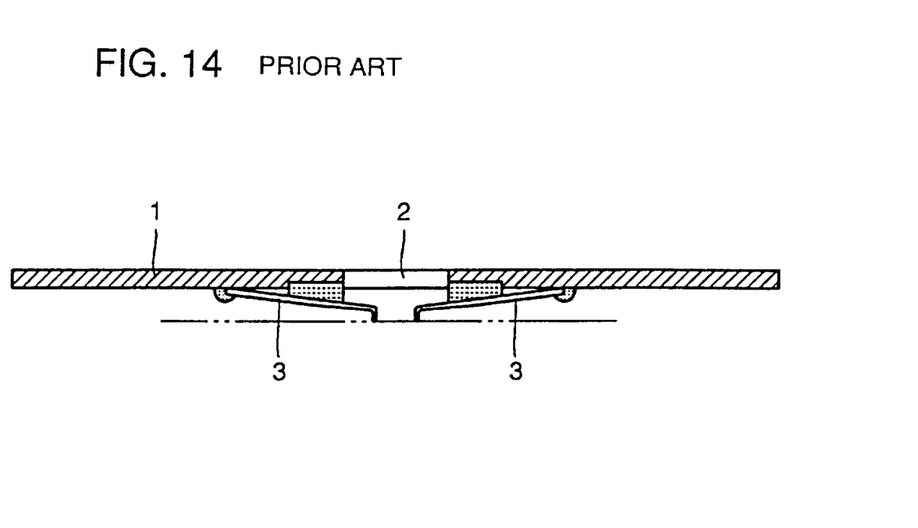
FIG. 14 is a cross sectional view showing a conventional probe card.

FIG. 14 is a cross sectional view showing a probe card using a conventional cantilever type probe needle disclosed by Japanese Utility Model Laying-Open No. 57-146340. The probe card includes a single printed circuit board 1 (hereinafter referred to as "substrate"). There is an opening 2 in the center of substrate 1. A plurality of probe needles 3 are radially provided on the bottom surface of substrate 1 having their tip ends in coincidence. The roots of probe needles 3 and a contact portion for connector connection (not shown) at an end of the printed circuit board are connected with one another by printed interconnections or wires.

Figure 15:
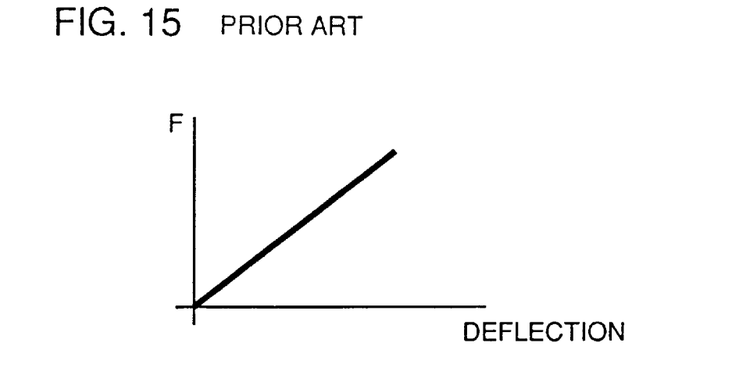
FIG. 15 is a graph showing the relation between the needle pressure and deflection of a conventional probe card.
Figure 16:
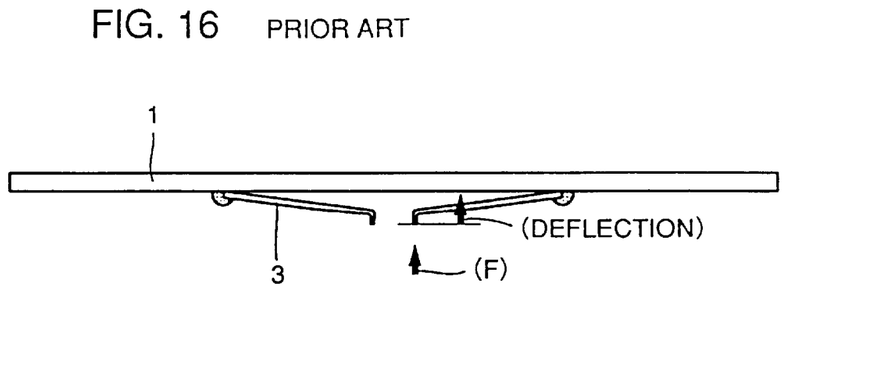
FIG. 16 is a view showing the directions of the needle pressure and deflection of the conventional probe card.

FIG. 15 shows the relation between the deflection and force (F) of the cantilever type probe needle. Herein, the deflection of the probe needle refers to the height of the tip end of probe needle 3 from the surface of substrate 1 as shown in FIG. 16. Herein, force (F) refers to needle pressure (F) applied on the probe needle in the height-wise direction overdrive.

Referring to FIG. 15, a linear relation is established between the deflection and the force of the probe needle. Generally, in an overdrive of about 100 µm, a needle pressure of about several g (for example, 7 g) is applied on the probe needle. Thus, the pad and the probe needle are electrically connected for testing the wafer.

The positional relation between the probe needle and the pad is critical in each of the directions of length, width and height, each of which requires precision as high as about ±10 µm. In the future high density ICs, higher precision will be requested. Today, the positional relation between a probe needle and a pad is adjusted manually. By such manual operation, the height of the probe needle (the distance between the tip end of the probe needle and the bottom surface of the substrate) cannot be readily adjusted.

Figure 17:
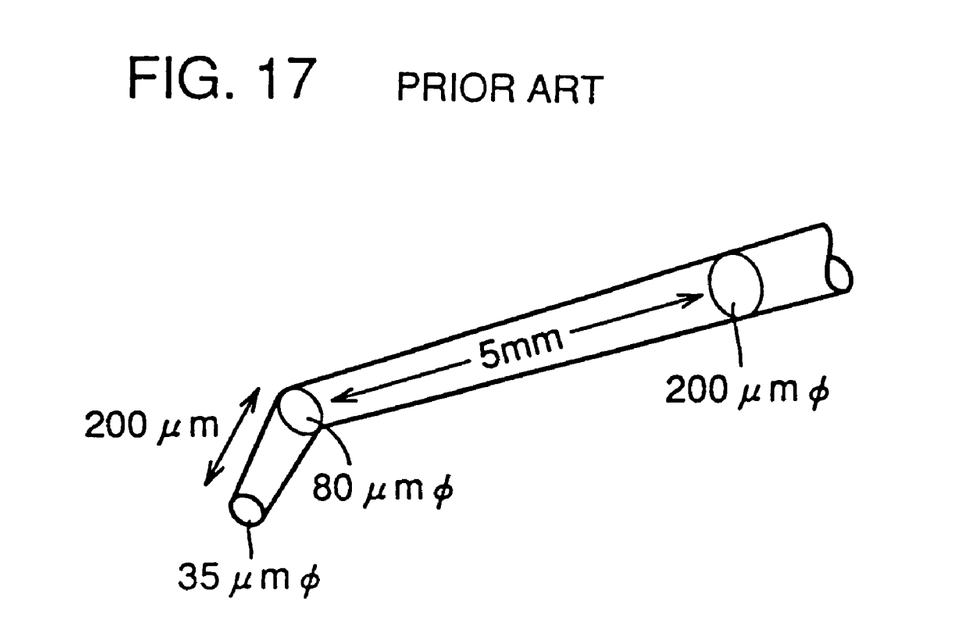
FIG. 17 is a view showing the concept of the conventional probe card.

FIG. 17 is a view showing the concept of a presently used cantilever type probe needle. The entire length of a small probe needle is about in the range from 5 mm to 10 mm. The length of the bent needle tip portion is about 200 µm. The diameter of the root of the probe needle is about 200 µmφ. The diameter of the tip end of the probe needle is about 35 µmφ. The probe needle is continuously tapered from its root toward its tip end. The diameter of the probe needle at the bent point is about 80 µmφ.

Since a number of probe needles are usually provided to a substrate, and the tolerance of variation in the height of probe needles is desirably about ±15 µm, but the complexity of the manual adjustment keeps the tolerance at the level of about ±30 µm.

If the variation in the height of the probe needles is large, correct needle pressure cannot be obtained. In addition, the large variation could lead to damages to ICs or makes it difficult to correctly determine the defectiveness and non-defectiveness of the ICs. Furthermore, as the pad is reduced in size in the future, when a probe needle is contacted with a pad and slided over the pad surface in an overdrive of about 100 µm, the needle tip could travel off the surface of the pad, thus tarnishing the reliability of the IC.

Furthermore, there is a demand for manufacturing probe cards less costly by simplifying the operation of adjusting probe needles. Under the circumstances, how to solve the variation in the height of the probe needles is a major problem to be solved.

SUMMARY OF THE INVENTION

It is therefore an object of the invention to provide an improved probe card which allows the variation in the height of probe needles to be several times the conventional tolerance.

Another object of the invention is to provide an improved probe card which permits correct needle pressure for a probe needle to be obtained.

Yet another object of the invention is to provide a probe card improved so as not to damage ICs.

A still further object of the invention is to provide an improved probe card which permits the contact resistance between a probe needle and a pad to be reduced.

An additional object of the invention is to provide an improved probe card which permits the non-defectiveness/defectiveness of an IC to be correctly determined.

Another additional object of the invention is to provide a method of testing wafer using such a probe card.

A probe card according to a first aspect of the invention includes a substrate and a probe needle. The probe needle has one end and the other end. The one end of the probe needle is fixed to the bottom surface of the substrate and extends at a prescribed angle to the substrate. The probe card includes an element for pressing a part of the probe needle positioned between the one and the other ends toward the substrate.

According to a second aspect of the invention, the probe card includes a pair of pillars provided on the bottom surface of the substrate and spaced apart from each other and a rod attached spanning the distance between the pair of pillars.

According to a third aspect of the invention, in the probe card, a plurality of such probe needles are attached to the bottom surface of the substrate. The probe needle has its tip end portion including the other end bent away from the bottom surface of the substrate. The distance between the other end and the bottom surface of the substrate is equal among the probe needles.

According to a fourth aspect of the invention, the probe needle of the probe card extends at an angle of 2° to 3° to the substrate.

According to a fifth aspect of the invention, the probe needle of the probe card has its tip end portion bent so as to be in contact with the surface of the pad provided on the chip at an angle of about 90°.

According to a sixth aspect of the invention, the rod of the probe card is formed of a non-conductive material.

According to a seventh aspect of the invention, the diameter of the probe needle of the probe card is reduced from the one end toward the other end. The diameter of the probe needle at the bending point is smaller than 80 $\mu m \phi$.

In a method of testing wafer according to an eighth aspect of the invention, a probe card including a probe needle having two ends, one end of which is fixed to the bottom surface of the substrate and extends at a prescribed angle to the substrate and a pressing element for pressing a portion of the probe needle positioned between the one end and the other end toward said substrate is prepared. The probe needle is contacted to the pad on the chip. Fixed pressure is applied on the probe needle and the pad.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be now described in conjunction with the accompanying drawings.

Figure 1:
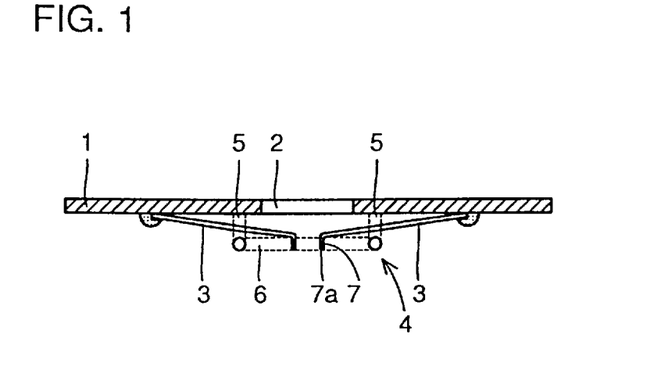
FIG. 1 is a view showing the concept of a probe card according to an embodiment of the invention.
Figure 2:
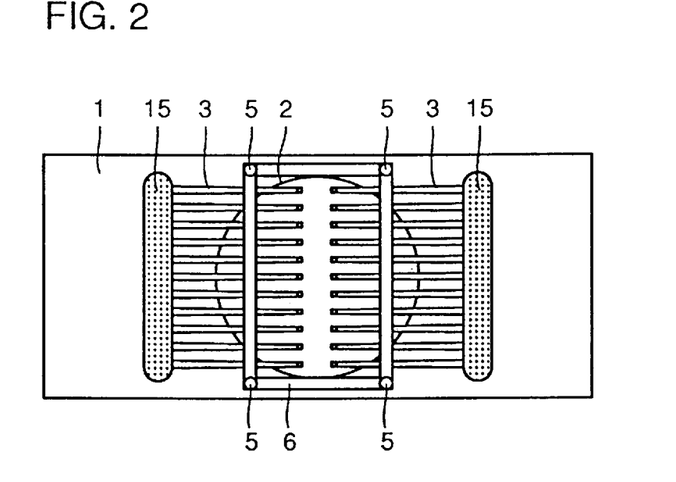
FIG. 2 is a view showing the bottom surface of the probe card according to the embodiment.

FIG. 1 is a view of a probe card according to an embodiment of the invention seen from one side. FIG. 2 is a view of the probe card according to the embodiment seen from the bottom surface side.

Figure 3:
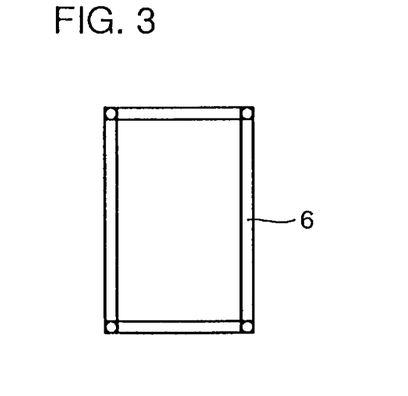
FIG. 3 is a view showing an example of pressing means used in the embodiment.

Referring to FIGS. 1 and 2, the probe card according to the embodiment of the invention includes a printed circuit board 1 (hereinafter referred to as "substrate 1") and a probe needle 3. Probe needle 3 has one end and the other end. Probe needle 3 has its one end fixed to the bottom surface of substrate 1 by solder 15 and extends at an angle in the range from 2° to 3° to the substrate. The probe card includes pressing means 4 for pressing a part of probe needle 3 positioned between the one end and the other end toward substrate 1. Pressing means 4 includes pillars 5 provided spaced apart from each other on the bottom surface of substrate 1 and a rod 6 attached spanning the distance between pillars 5. Rod 6 is preferably formed into a frame as shown in FIG. 3.

A number of such probe needles 3 are provided on the bottom surface of substrate 1. Probe needle 3 has its tip end portion 7 including the other end bent away from the bottom surface of substrate 1. Among probe needles 3, the distance between the other end 7a and the bottom surface of substrate 1 is equal.

Figure 4A:
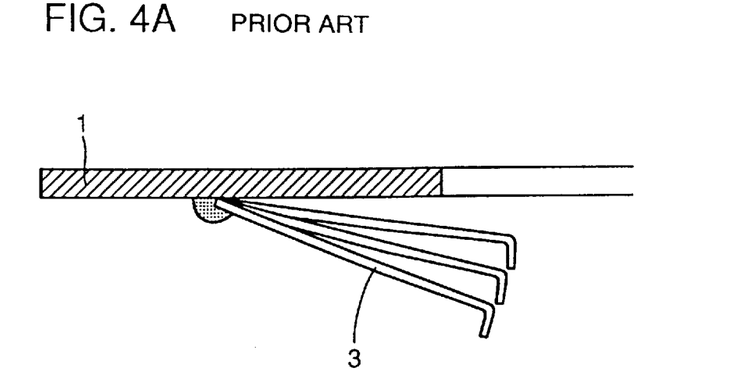
FIG. 4A is a view showing the arrangement of a conventional probe needle.
Figure 4B:
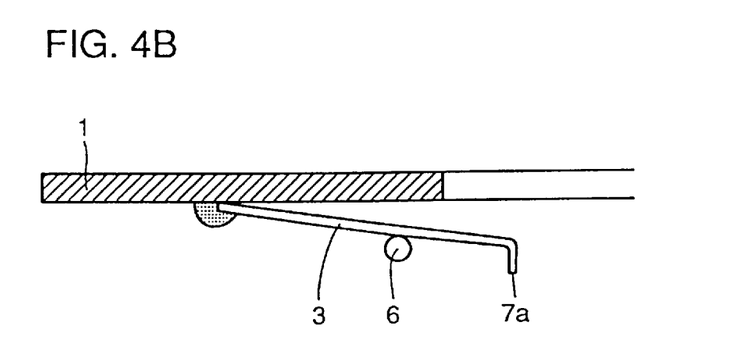
FIG. 4B is a view showing the arrangement of a probe needle according to the embodiment.

More specifically, referring to FIG. 4A, in the conventional probe card, the distances between probe needles 3 and substrate 1 in the height-wise direction vary. In the probe card according to the embodiment, as shown in FIG. 4B, there is no such variation among probe needles 3 in the height-wise direction, and the distance from the other end 7a to the bottom surface of substrate 1 is equal among probe needles 3.

Figure 5:
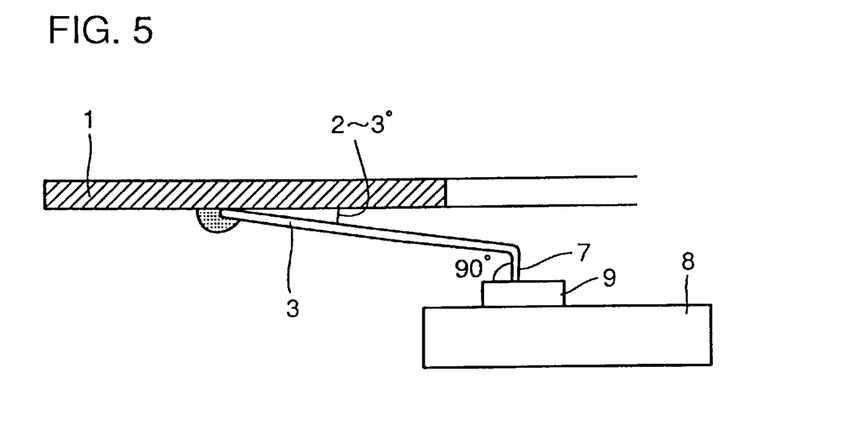
FIG. 5 is a view showing the structure of the tip end portion of the probe needle according to the embodiment.

Referring to FIG. 5, probe needle 3 has its tip end portion 7 bent so as to be in contact with the surface of pad 9 on chip 8 at an angle of about 90°.

The operation of the probe card according to the embodiment will be now described.

Figure 6:
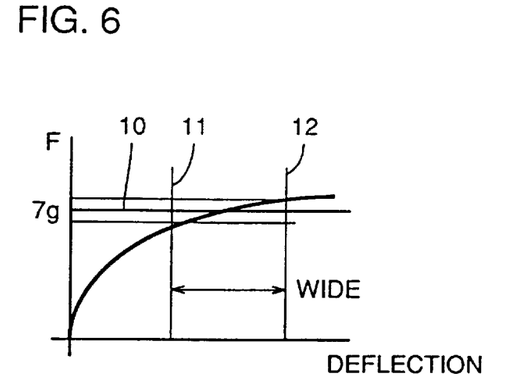
FIG. 6 is a graph showing a desirable relation between the deflection and force of the probe needle according to the present invention.

FIG. 6 is a graph showing a desirable relation between the deflection and force of a probe needle in the probe card according to the embodiment. "Deflection" in the abscissa represents the length of overdrive imposed at the tip end of the needle, in other words, the height from the substrate to the tip end of the needle. Force "F" in the ordinate represents needle pressure applied on the tip end of the needle during overdrive.

In FIG. 6, line 10 represents a pressure of about 7 g, generally an appropriate needle pressure applied on the pad surface. Lines 4 and 5 represent the lower and upper limits of the height of a probe needle to provide the fixed needle pressure of 7 g. The greater the space between lines 11 and 12, the wider variation is tolerated for the height of the probe needles. As shown in FIG. 6, if the relation between force and deflection is represented in a saturated curve, not a straight line, a needle pressure of about 7 g may be provided even with the presence of some difference in height between the plurality of probe needles, and good contact may be achieved.

Note that in this embodiment, a probe needle thinner than the conventional probe needle shown in FIG. 17 is used for the following reason.

Figure 7:
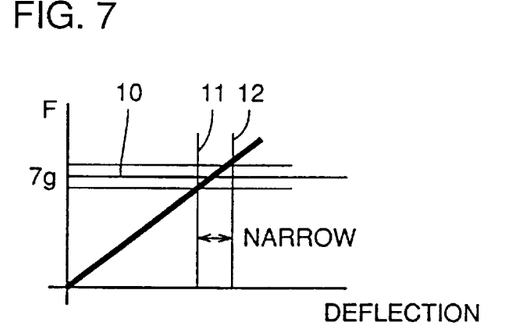
FIG. 7 is a graph showing the relation between force and deflection when a thick probe needle is used.

FIG. 7 is a graph showing the relation between force and deflection when a thick probe needle having high elasticity is used.

Figure 8:
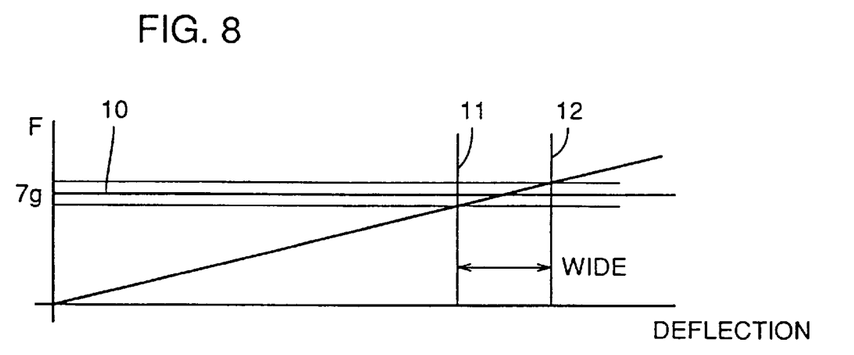
FIG. 8 is a graph showing the relation between force and deflection when a thin probe needle is used.

FIG. 8 is a graph showing the relation between deflection and force when a thin probe needle having low elasticity. Reference numerals 10, 11 and 12 represent the same items as above.

Referring to FIG. 7, when the thick probe needle is used, the gradient of the line representing the relation between the deflection and force is steep, which makes narrow the space between straight lines 11 and 12. Meanwhile, referring to FIG. 8, when the thin probe needle is used, the gradient of the straight line representing the relation between the force and deflection is gentle, which makes wide the space between lines 4 and 5. More specifically, it shows that the user of the thin probe needle obtains the needle pressure of about 7 g even if there is a large variation in the height of the probe needles.

Figure 9:
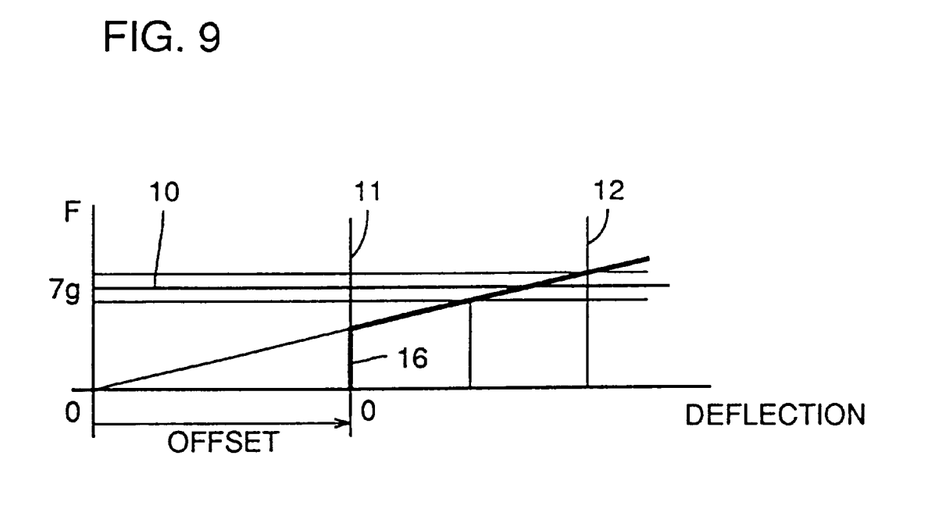
FIG. 9 is a graph showing the relation between the deflection and force of the probe needle according to the embodiment, which clearly shows the significance of offset.

FIG. 9 is a graph showing the relation between the deflection and force of the probe card according to the embodiment shown in FIG. 1. By providing pressing means, an offset region is provided in the abscissa. Since a thin probe needle is used, the space between lines 11 and 12 is wide. Line 16 in FIG. 9 approximates the desirable force-deflection relation shown in FIG. 6 according to the present invention.

Figure 10:
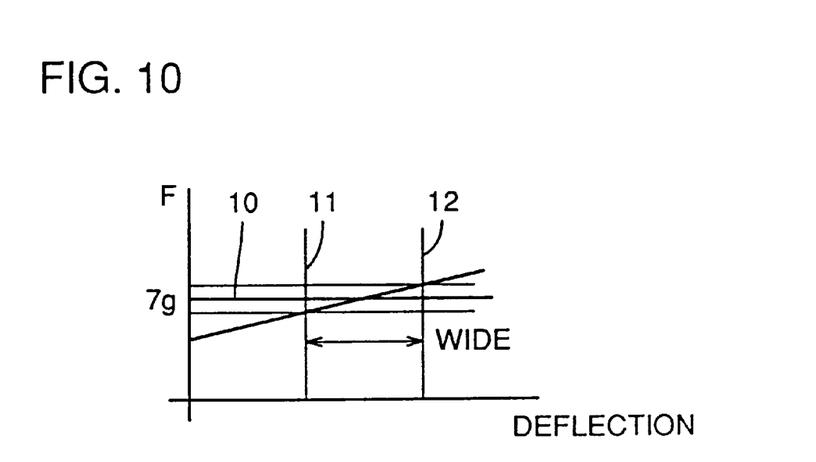
FIG. 10 is a graph showing the relation between the needle pressure and deflection of the probe card according to the embodiment.

FIG. 10 is a graph showing the relation between the deflection and force of the probe card according to the embodiment based on FIG. 9.

The present invention will be now described in further detail by referring to a method of manufacturing the probe card according to the embodiment.

Figure 11:
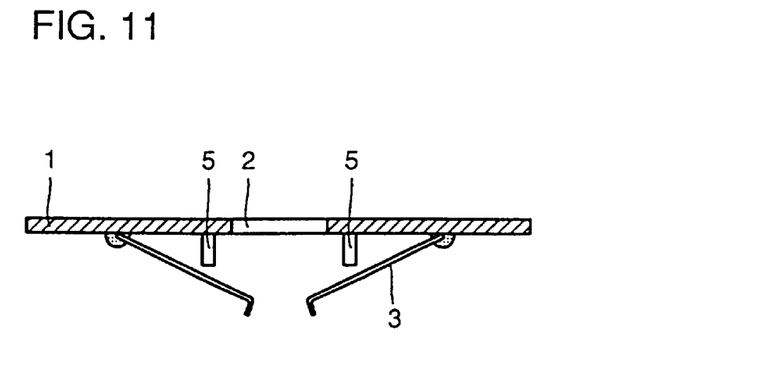
FIG. 11 is a view showing the concept of a first step in the process of a method of manufacturing the probe card according to the embodiment.
Figure 12:
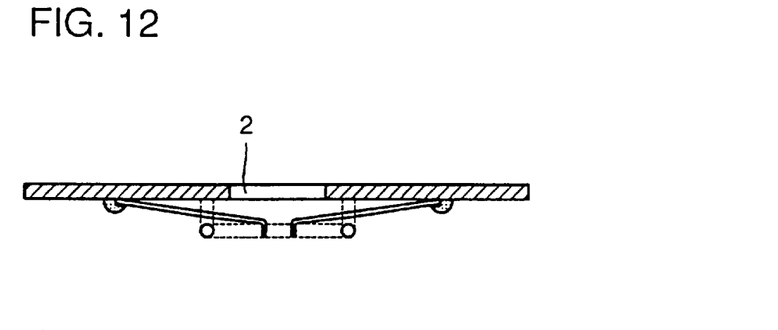
FIG. 12 is a view showing the concept of a second step in the process of a method of manufacturing the probe card according to the embodiment.
Figure 13:
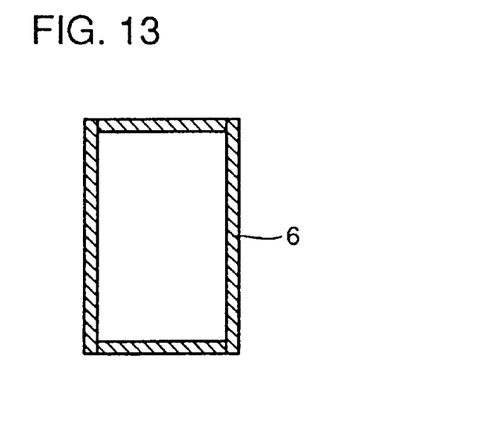
FIG. 13 is a view showing an example of pressing means.

Referring to FIG. 11, a probe needle 3 thinner than a conventional needle is attached at a large angle to substrate 1 including pillars 5. The probe needle is attached by soldering. A frame formed of a combination of rods 6 as shown in FIG. 13 is prepared. Referring to FIG. 12, the frame is secured to pillars 5 so as to press probe needle 3 toward substrate 1. The probe card as shown in FIG. 1 is thus completed.

Rod 6 is formed of a non-conductive material. A non-conductive plate may be pressed against probe needle 3 in place of rod 6. In this embodiment, since probe needles are arranged in two rows, rods 6 are contacted to these two rows at a time to press probe needles 3 toward substrate 1. A frame having four sides as shown in FIG. 13 is therefore preferably used.

The advantage of the probe card according to the embodiment will be described. In the probe card according to the embodiment, the probe needle thinner than the conventional probe needle is used, and the characteristic of the probe needle as represented by the saturated curve in FIG. 6 (as shown in FIG. 10 in practice) is desirably provided. Therefore, as the operation of contacting the probe needle is initiated, good contact to the pad may be achieved even if the heights of the tip ends of probe needles vary greater than the conventional ones. As a result, the operation of adjusting the heights of probe needles may be simplified. Furthermore, earlier delivery of probe cards may be enabled, which reduces the cost. In addition, such stable contact permits the non-defectiveness and defectiveness of chips to be correctly determined. Furthermore, the yield of wafer testing may be improved.

Note that in the probe card according to the present invention, the great variation among probe needles in the height-wise direction can be absorbed. However, as with the conventional case, overdrive of at least the variation should be applied. In the conventional probe card, the operation of overdrive causes variation in the sliding of the tip end portion of a probe needle from its bent portion toward the tip end, and the tip end of the probe needle could fall off a pad if the pad is small. Such a problem could be solved by reducing the length of tip end 7 of probe needle 3 and setting an angle to the pad surface during contacting to about 90°.

Note that in the above embodiment, the probe card having probe needles arranged in two rows is described by way of illustration, the present invention is not limited to this, and the same effects may be provided if the invention is applied to a probe card having probe needles arranged in four or more rows.

In the above embodiment, the probe needles are arranged in rows on a substrate, the invention is by no means limited to this arrangement, and the invention is applicable to the case in which probe needles are radially arranged. In the latter case, a plurality of probe needles are preferably pressed against a substrate by a ring being shaped like a doughnut.

In the probe card according to the first aspect of the invention, the portion of the probe needle positioned between the one end and the other end is pressed toward the substrate, and therefore the tolerance for the variation in the height of probe needles can be advantageously increased.

In the probe card according to the second aspect of the invention, the pressing means is formed of the pair of pillars provided to the substrate and the rods attached spanning the distance between the pair of pillars, and therefore the probe card can be manufactured less costly.

In the probe card according to the third aspect of the invention, the distance between the other end and the bottom surface of the substrate is equal among the probe needles, appropriate needle pressure can be obtained.

In the probe card according to the fourth aspect of the invention, since the angle between the probe needle and the substrate is in the range from 2° to 3°. The variation in the height of the tip ends of the probe needles can be advantageously reduced.

In the probe card according to the fifth aspect of the invention, the probe needles are each bent to be in contact with the surface of the pad provided on the chip at an angle of about 90°, the tip end portion of each probe needle will not fall off the pad if the pad is reduced in size.

In the probe card according to the sixth aspect of the invention, rods used for pressing means are formed of a non-conductive material, a probe card having good electrical characteristic may be advantageously provided.

In the probe card according to the seventh aspect of the invention, the diameter of each probe needle at its bent point is smaller than $80 \mu m\phi$ and the tolerance for the variation in the height of probe needles can be effectively increased as compared to the conventional case.

According to the eighth aspect of the invention, in a wafer testing method, the probe card having the above-described characteristic is used for testing wafer, the tolerance for the variation in the height of the probe needles can be increased as compared to the conventional case, and wafer testing can be advantageously conducted without damaging ICs.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A probe card, comprising:

a substrate;

a plurality of probe needles, each probe needle having:
- a first end and a second end, said first end being fixed to a bottom surface of said substrate; and
- a portion extending outwardly from the substrate at a prescribed angle non-parallel to the substrate; and pressing means for pressing said portion of said probe needle toward said substrate, said pressing means including:
- at least one pair of pillars provided spaced apart from each other on the bottom surface of said substrate; and
- a rod attached spanning the distance between said at least one pair of pillars.

2. The probe card as recited in claim 1, wherein a plurality of said probe needles are attached on the bottom surface of said substrate, said probe needle has its tip end portion including said second end bent away from the bottom surface of said substrate at a bent point, and the distance between said second end and the bottom surface of said substrate is equal among the probe needles.

3. The probe card as recited in claim 2, wherein said probe needle has said its tip end portion bent to be in contact with the surface of a pad provided on a chip at an angle of about 90°.

4. The probe card as recited in claim 2, wherein the diameter of said probe needle is reduced from said first end toward said second end, and the diameter of said probe needle is set smaller than 80 $\mu m\phi$ at said bent point.

5. The probe card as recited in claim 1, wherein said prescribed angle is in the range from 2° to 3°.

6. The probe card as recited in claim 1, wherein said rod is formed of a non-conductive material.

7. A method for testing wafer, comprising the steps of:

preparing a probe card including: (a) a substrate, (b) a probe needle having first and second ends, said first end being fixed to the bottom surface of said substrate, and a portion extending outwardly from the substrate at a prescribed angle non-parallel to the substrate, and (c) pressing means for pressing said portion of said probe needle toward said substrate said pressing means including at least one pair of pillars provided spaced apart from each other on the bottom surface of said substrate and a rod attached spanning the distance between said at least one pair of pillars;

making said probe needle contact with a pad on a chip; and applying fixed pressure between said probe needle and said pad.

* * * * *